United States Patent [19]
Allman et al.

[11] Patent Number: 5,312,512
[45] Date of Patent: May 17, 1994

[54] GLOBAL PLANARIZATION USING SOG AND CMP

[75] Inventors: Derryl D. J. Allman; Kenneth P. Fuchs, both of Colorado Springs, Colo.

[73] Assignee: NCR Corporation, Dayton, Ohio

[21] Appl. No.: 965,309

[22] Filed: Oct. 23, 1992

[51] Int. Cl.⁵ .................. H01L 21/306; H01L 21/465
[52] U.S. Cl. .................................. 156/636; 437/231; 437/228
[58] Field of Search ................. 437/231, 228; 156/636

[56] References Cited

U.S. PATENT DOCUMENTS

| | | | |
|---|---|---|---|
| 3,928,225 | 12/1975 | Schäfer | 252/182 |
| 4,355,454 | 10/1982 | Tasch, Jr. et al. | 29/571 |
| 4,400,411 | 8/1983 | Yuan et al. | 437/228 |
| 4,433,008 | 2/1984 | Schnable et al. | 427/85 |
| 4,455,325 | 6/1984 | Razouk | 427/85 |
| 4,571,366 | 2/1986 | Thomas et al. | 428/446 |
| 4,603,468 | 8/1986 | Lam | 29/571 |
| 4,606,114 | 8/1986 | Kraus | 29/571 |
| 4,628,589 | 12/1986 | Sundaresan | 29/571 |
| 4,661,177 | 4/1987 | Powell | 148/189 |
| 4,775,550 | 10/1988 | Chu et al. | 437/231 |
| 4,826,786 | 5/1989 | Merenda et al. | 437/231 |
| 4,835,113 | 5/1989 | Celler et al. | 437/37 |
| 4,837,179 | 6/1989 | Foster et al. | 437/44 |
| 4,891,331 | 1/1990 | Rapp | 437/164 |
| 4,983,546 | 1/1991 | Hyun et al. | 437/231 |
| 4,986,878 | 1/1991 | Malazgirt et al. | 437/231 |
| 4,996,168 | 2/1991 | Ozaki et al. | 437/164 |
| 5,024,959 | 6/1991 | Pfiester | 437/34 |
| 5,047,357 | 9/1991 | Eklund | 437/357 |
| 5,158,898 | 10/1992 | Hayden et al. | 437/228 |
| 5,169,491 | 12/1992 | Doan | 437/228 |

FOREIGN PATENT DOCUMENTS

| | | |
|---|---|---|
| 53-135263 | 11/1978 | Japan . |
| 57-194525 | 11/1982 | Japan . |
| 61-87322 | 5/1986 | Japan . |
| 62-60220 | 3/1987 | Japan . |
| 62-216322 | 9/1987 | Japan . |
| 1-8615 | 1/1989 | Japan . |
| 1-194416 | 8/1989 | Japan . |
| 1-283828 | 11/1989 | Japan . |

OTHER PUBLICATIONS

L. D. Molnar, "SOG Planarization Proves Better Than Photoresist Etch Back," *Semiconductor International*, Aug. 1989, pp. 92-96.

S. Wolf, *Silicon Processing for the VLSI Era, vol. 2*, Lattice Press, Sunset Beach, Calif., 1990, pp. 229-239.

Anonymous, "Planarization Process using spin-on-glass and polishing", *Research Disclosure*, Jun. 1991 RD-32635 p. 404.

*Primary Examiner*—Richard Bueker
*Assistant Examiner*—Linda J. Fleck
*Attorney, Agent, or Firm*—Paul W. Martin

[57] ABSTRACT

A method for planarizing the surface of a semiconductor device which employs spin on glass (SOG) and an etching operation to remove high portions of the SOG prior to a chemical metal polish (CMP) operation. The SOG is baked and cured before etching. Additional layers of SOG and etching operations may be employed as necessary. A thick encapsulating oxide layer is deposited over the SOG layer. For surface irregularities caused by metal lines, an insulating layer may be deposited over the surface before the SOG. Where an additional metal line is to be deposited on the surface, an additional insulating layer is deposited after the CMP operation. In the case of metal lines made of aluminum, provision is also made for preventing Hillock formations on the metal lines.

2 Claims, 4 Drawing Sheets

GLOBAL PLANARIZATION USING SOG AND CMP

CROSS REFERENCE TO RELATED APPLICATIONS

The present invention is related to the following commonly assigned and co-pending U.S. applications, which have been filed concurrently with the present application:

"Shallow Junction SOG Process," invented by Allman et al., and a Ser. No. 07/965,822;

"Selective Sidewall Diffusion Process using Doped SOG," invented by Allman et al., and a Ser. No. 07/961,967;

"Method for Forming a Bipolar Emitter Using Doped SOG," invented by Allman et al., and a Ser. No. 07/961,973; and "Bipolar Transistor Formation Using Doped SOG," invented by Allman et al., and a Ser. No. 07/965,823.

BACKGROUND OF THE INVENTION

The present invention relates to methods for producing integrated circuit devices and more specifically to a method for planarizing integrated circuit devices using spin on glass (SOG) and chemical mechanical polish (CMP).

Planarization of integrated circuit devices is necessary and desirable to facilitate masking and etching operations. A planarized surface provides a constant depth of focus across the surface of a die for exposing patterns in a photolithography emulsion. While complete planarization is desirable, it is difficult to achieve as the topology of integrated circuit varies across the surface of a die on a wafer.

Planarization of metal interconnect layers improves the yield of devices off of a wafer and the reliability of such devices. Planarization allows the metal interconnect layer to be at a constant thickness across the circuit of a die. Planarization also minimizes the presence of cavities and allows metal interconnect lines to be continuous, where they would otherwise be discontinuous over a non-planar surface containing cavities.

Known methods for planarizing sub-micron device geometries include multiple silicon oxide depositions with insitu etches to fill the spaces between metal lines prior to CMP. This method is also used to fill cavities within the silicon, with an etch process being used to etch away oxide outside the cavities.

However, this method suffers from the disadvantages of high expense, low throughput, process complexity, high defect density, and the presence of material having a high dielectric constant between adjacent metal lines. For surfaces having aspect ratios (defined as the height of a feature divided by the distance to the closest feature) greater than about 1.6, this method fails.

Therefore, it would be desirable to provide a planarization process which does not suffer from the disadvantages of known planarization steps.

SUMMARY OF THE INVENTION

In accordance with the teachings of the present invention, a method for planarizing the surface of a semiconductor die and wafer is provided. The method employs spin on glass (SOG) and an etching operation to remove high portions of the SOG and the deposition of an insulating layer prior to a chemical mechanical polish (CMP) operation. The SOG is baked and cured before etching. Additional layers of SOG and etching operations are employed as necessary. An encapsulating oxide layer is deposited over the SOG layer after the etch process. For surface irregularities caused by metal lines, an insulating layer may be deposited over the surface before the SOG is applied. An additional insulating layer is deposited after the CMP operation if necessary. In the case of metal lines made of aluminum, provision is also made for preventing hillock formations on the metal lines and providing a polishing stop for the CMP process.

It is accordingly an object of the present invention to provide a global planarization method using doped SOG and CMP.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

DETAILED DESCRIPTION OF THE PREFERRED EMBODIMENT

Figure 1:
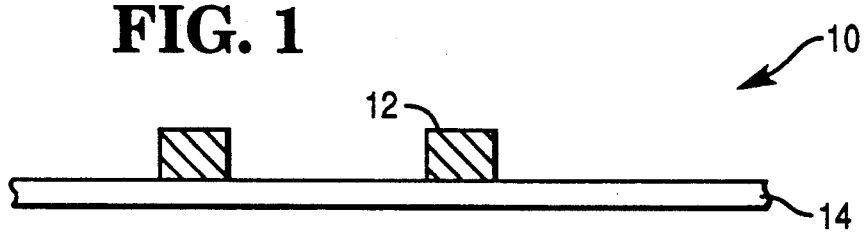
FIG. 1 is a cross-sectional view of a part of an integrated circuit having an uneven surface.

Referring now to FIG. 1, part 10 of an integrated circuit device is shown. Part 10 includes raised features 12, which are shown as metal lines on a silicon wafer 14.

Figure 2:
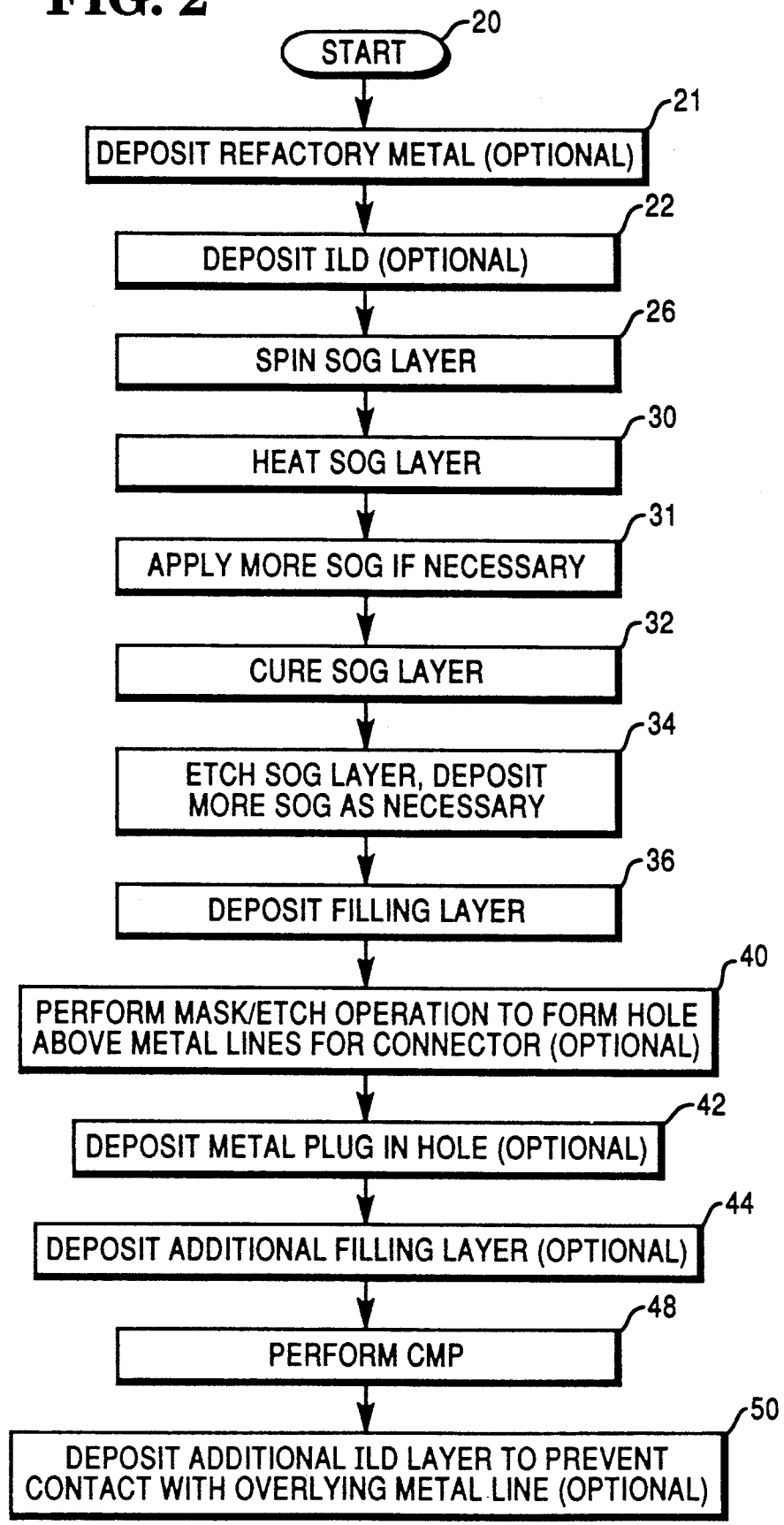
FIG. 2 is a flow diagram illustrating the method of the present invention.

Turning now to FIG. 2, the planarization method of the present invention is shown, beginning with START 20. In block 21, an optional layer of hard refractory metal, such as titanium nitride, titanium tungstide, titanium carbide, tungsten, or titanium may be deposited on aluminum metal lines 12 to act as a polish stop for the CMP process. The hard refractory material would prevent removal of smearing of aluminum, and suppress hillock growth.

Figure 3:
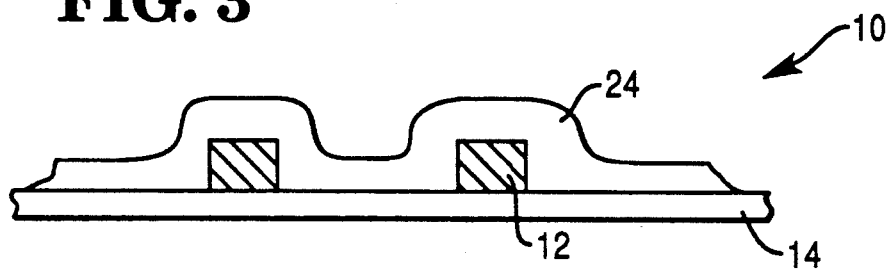
FIG. 3 is a cross-sectional view of a part of the integrated circuit of FIG. 1 at another point in the planarization process.

In block 22, an interlevel dielectric level (ILD) 24 (FIG. 3) is deposited, if necessary. Preferably, ILD 24 is a layer of tetra-ethyl-ortho-silicate (TEOS) for submicron technologies. Other organic oxides may be used or a hydride source may be used.

Use of ILD 24 is not preferred unless it is necessary. SOG has a lower dielectric constant than the oxide used to form ILD 24. Using only SOG to fill the gaps between metal lines 12 reduces crosstalk between them, and also reduces the time delay for a signal propagating along metal lines 12.

Figure 4A:
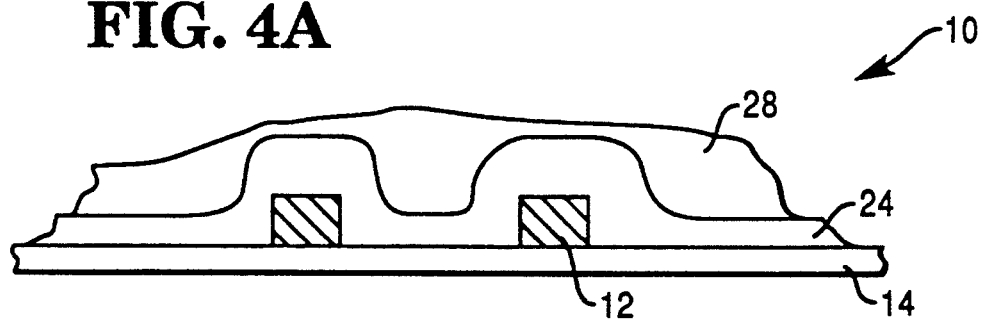
FIG. 4a is a cross-sectional view of a part of the integrated circuit of FIG. 3 at another point in the planarization process.
Figure 4B:
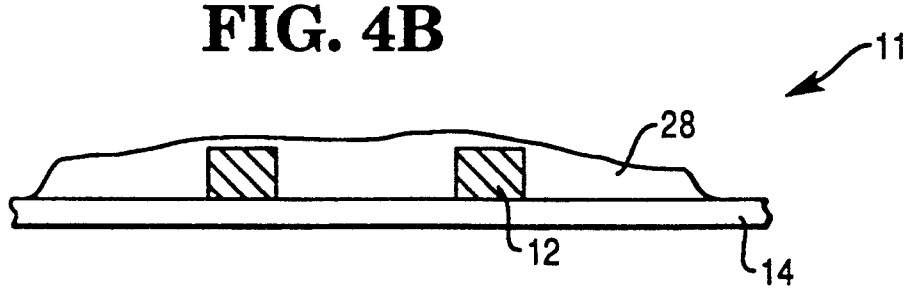
FIG. 4b is a cross-sectional view of a part of the integrated circuit of FIG. 1 at another point in the planarization process.

In block 26, a layer of SOG 28 is spun onto ILD 24 (FIG. 4a). If ILD 24 has not been deposited, a layer of SOG 28 is spun over metal lines 12 (FIG. 4b) to form device 11.

In block 30, SOG layer 28 is heated to drive out water. Preferably, a hot plate process at 200 degrees Celsius for one minute is employed.

In block 31, additional SOG may be deposited as necessary.

In block 32, SOG layer 28 is cured to remove all trapped low-boiling point trapped organics or solvents and to lower the etch rate of SOG layer 28 to match that of the ILD 24 below it, if deposited.

Figure 5A:
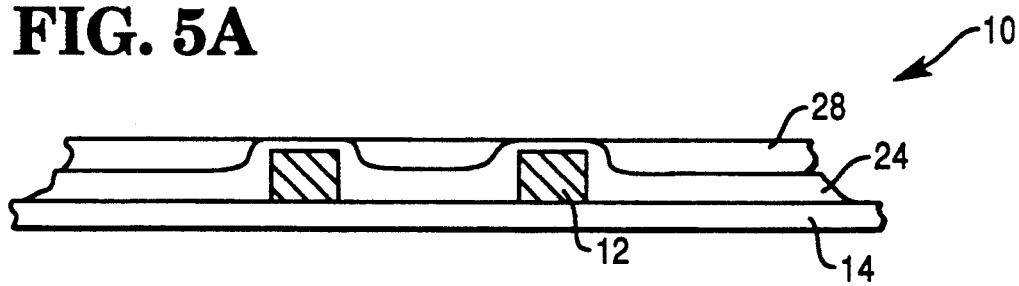
FIG. 5a is a cross-sectional view of a part of the integrated circuit of FIG. 4a at another point in the planarization process.
Figure 5B:
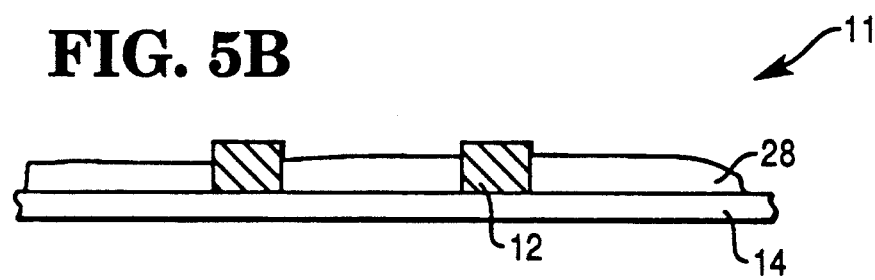
FIG. 5b is a cross-sectional view of a part of the integrated circuit of FIG. 4b at another point in the planarization process.

In block 34, SOG layer 28 is etched to about the top of raised features 12. Preferably, a plasma etch process is employed. For device 11, which includes ILD 24, FIG. 5a illustrates that etching preferably extends to a point above metal lines 12. For device 10, which does not include ILD 24, FIG. 5b illustrates that etching may extend below the top of metal lines 12.

If more SOG is needed to planarize devices 10 or 11, then more SOG layers having thicknesses between about 1000 to 7000 angstroms may be spun onto SOG layer 28 before performing the etch process of block 32. If further SOG layers are needed, then the baking step must be performed for each additional SOG layer.

Figure 6A:
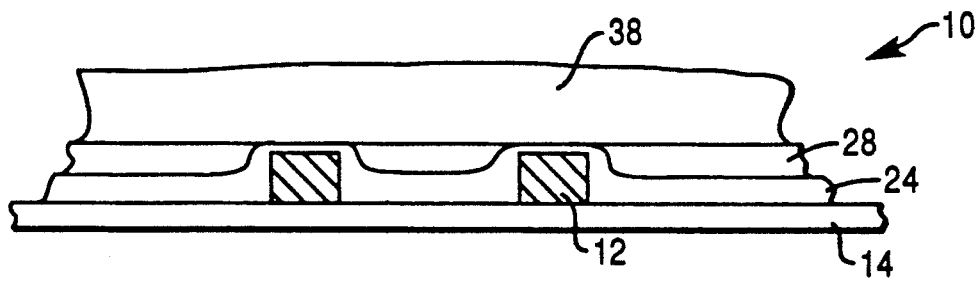
FIG. 6a is a cross-sectional view of a part of the integrated circuit of FIG. 5a at another point in the planarization process.
Figure 6B:
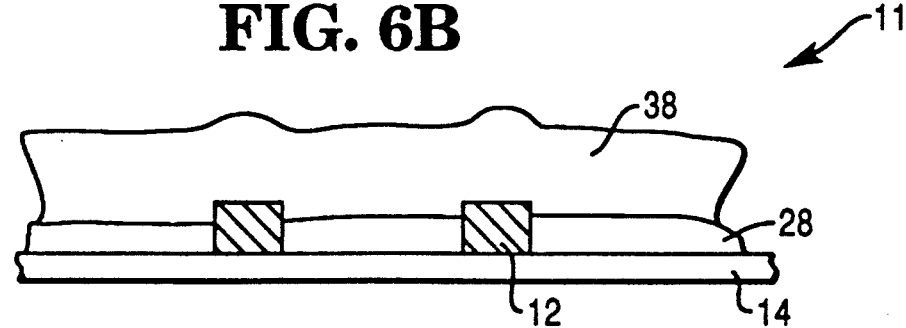
FIG. 6b is a cross-sectional view of a part of the integrated circuit of FIG. 5b at another point in the planarization process.

In block 36, a thick encapsulating oxide layer 38 is deposited over devices 10 and 11 (FIGS. 6a and 6b). Preferably, plasma enhanced chemical vapor deposition (PECVD) TEOS oxide is employed. Other materials might include PECVD silane oxide (siloxane) nitride, or oxynitride.

Figure 7A:
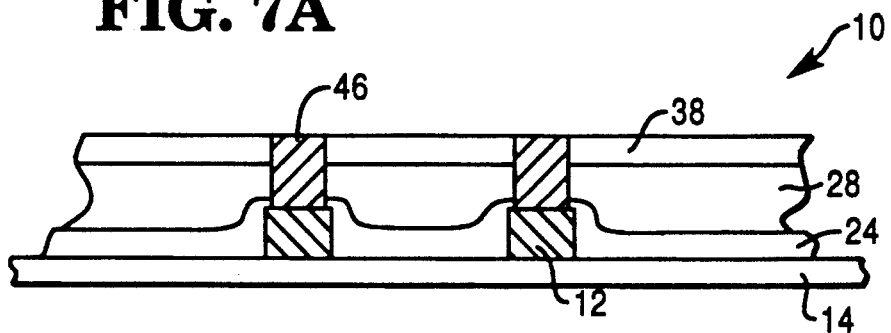
FIG. 7a is a cross-sectional view of a part of the integrated circuit of FIG. 6a at another point in the planarization process.
Figure 7B:
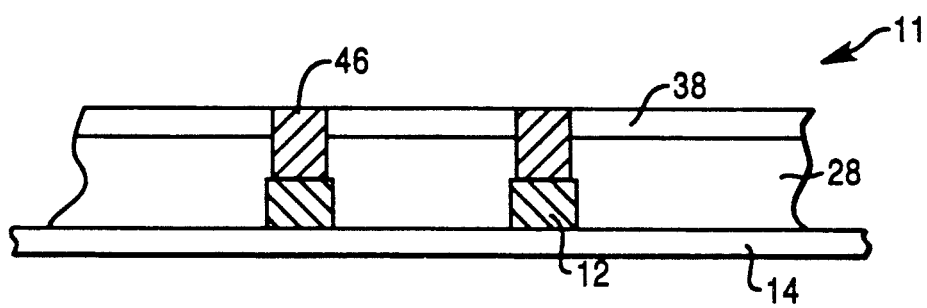
FIG. 7b is a cross-sectional view of a part of the integrated circuit of FIG. 6b at another point in the planarization process.
Figure 8A:
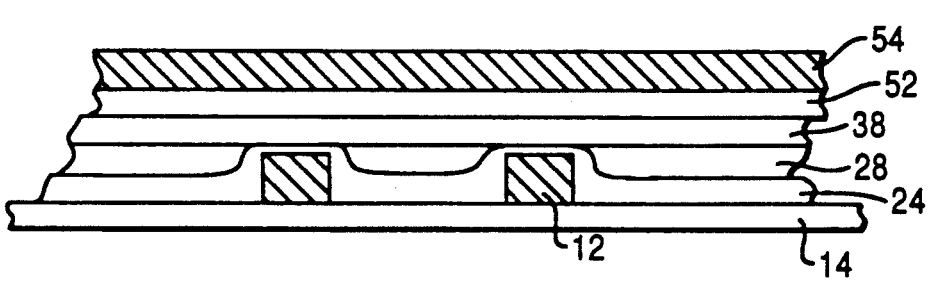
FIG. 8a is a cross-sectional view of a part of the integrated circuit of FIGS. 6a or 7a at another point in the planarization process.
Figure 8B:
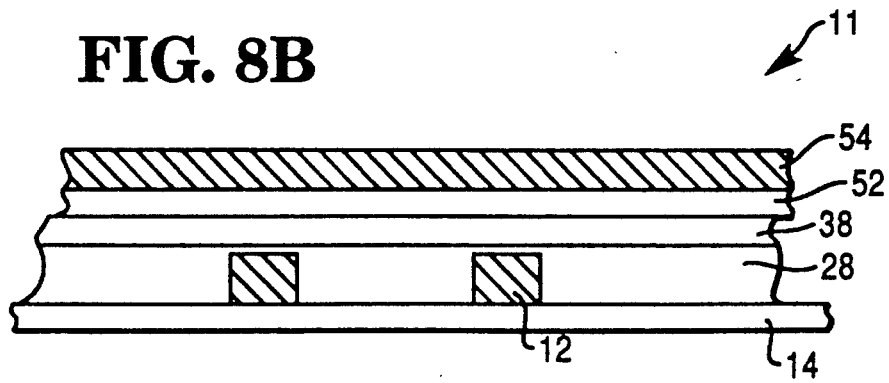
FIG. 8b is a cross-sectional view of a part of the integrated circuit of FIGS. 6b or 7b at another point in the planarization process.

Blocks 40–44 add optional steps to the process if metal lines 12 are aluminum metal lines. In block 40, a mask and etch is performed to cut a hole down to metal lines 12 In block 42, a metal plug 46, preferably tungsten, is deposited into the hole to provide contact between metal lines 12 and an overlying metal line 54 (FIGS. 8a and 8b). Tungsten is used to prevent hillock formations. In block 44, additional filling may be required as in block 36 (FIGS. 7a and 7b).

The tungsten plug operation above does not have to be used to form a contact between metal lines 12 and an overlying conductor. Standard semiconductor processing, using a barrier metal layer followed by an aluminum layer deposited on the top planarized surface and into the hole, may be employed to provide the overlying metal line 54 and the connection to metal lines 12.

In block 48, a CMP process is performed.

In block 50, an additional ILD 52 may be deposited to provide insulation between metal lines 12 and metal line 54 over ILD 52 (FIGS. 8a and 8b). Block 50 is another optional step, which may be performed following block 44 if contact is desired between metal lines 12 and metal line 54. If contact is not desired, then block 50 follows block 36.

Although the present invention has been described with particular reference to certain preferred embodiments thereof, variations and modifications of the present invention can be effected within the spirit and scope of the following claims.

What is claimed is:

1. A method of planarizing a semiconductor device having an irregular surface with high and low portions, wherein the semiconductor device has a plurality of aluminum metal lines causing the irregular surface, the method comprising the steps of:

depositing a PECVD siloxane ILD layer over the surface;

spinning a layer of SOG over the ILD layer;

heating the SOG layer to drive out solvents and low-boiling point organics, including the substep of performing a hot plate process at temperatures between about 50 to 300 degrees Celsius for about one second to five minutes;

curing the SOG layer;

etching away higher portions of the SOG layer;

depositing an oxide filling layer over the SOG layer;

perform a mask and etch operation to form holes through the oxide filling layer and the SOG layer down to the metal lines;

depositing plugs into the holes and in contact with the metal lines, wherein the plugs are tungsten to prevent hillock formations;

performing a CMP operation to smooth the oxide filling layer; and depositing another aluminum metal line over the oxide filling layer and in contact with the tungsten plugs.

2. A method of planarizing a semiconductor device having an irregular surface with high and low portions, wherein the semiconductor device has a plurality of metal lines causing the irregular surface, the method comprising the steps of:

depositing a PECVD siloxane ILD layer over the surface;

spinning a layer of SOG over the ILD layer;

heating the SOG layer to drive out solvents and low-boiling point organics, including a substep of performing a hot plate process at temperatures between about 50 to 300 degrees Celsius for about one second to five minutes;

curing the SOG layer;

etching away higher portions of the SOG layer;

depositing an oxide filling layer over the SOG layer which fills voids between the metal lines, wherein the oxide filling layer extends from the SOG layer to about 5000 angstroms to 2 microns above the metal lines;

performing a CMP operation to smooth the oxide filling layer;

depositing a second PECVD siloxane ILD layer over the smoothed oxide filling layer; and depositing another metal line over the second ILD layer.

* * * * *